(12) United States Patent
Kim et al.

(10) Patent No.: US 9,847,738 B2
(45) Date of Patent: Dec. 19, 2017

(54) SYSTEM AND METHOD FOR ELECTRIC POWER GENERATION USING STRUCTURED STACKED PIEZOELECTRIC ARRAYS

(71) Applicants: Namhyo Kim, Houston, TX (US); Alvaro Jose Arrazola, Houston, TX (US); James Benjamin Bloys, Katy, TX (US)

(72) Inventors: Namhyo Kim, Houston, TX (US); Alvaro Jose Arrazola, Houston, TX (US); James Benjamin Bloys, Katy, TX (US)

(73) Assignee: CHEVRON U.S.A. INC., San Ramon, CA (US)

( * ) Notice: Subject to any disclaimer, the term of this patent is extended or adjusted under 35 U.S.C. 154(b) by 573 days.

(21) Appl. No.: 14/529,686

(22) Filed: Oct. 31, 2014

(65) Prior Publication Data

US 2016/0126866 A1   May 5, 2016

(51) Int. Cl.
*H01L 41/113* (2006.01)
*H02N 2/18* (2006.01)

(52) U.S. Cl.
CPC .......... *H02N 2/185* (2013.01); *H01L 41/113* (2013.01)

(58) Field of Classification Search
CPC .......... F23Q 3/002; H01L 2/18; H01L 41/113; H02N 2/185
USPC ........................................................ 310/339
See application file for complete search history.

(56) References Cited

U.S. PATENT DOCUMENTS

| | | | | |
|---|---|---|---|---|
| 6,973,972 | B2 * | 12/2005 | Aronstam | E21B 37/00 166/177.2 |
| 2008/0277941 | A1 * | 11/2008 | Bowles | E21B 41/0085 290/54 |
| 2009/0140604 | A1 * | 6/2009 | Chen | E21B 41/0085 310/311 |
| 2010/0219646 | A1 * | 9/2010 | Hay | E21B 41/0085 290/1 A |
| 2012/0032560 | A1 * | 2/2012 | Ochoa | E21B 41/0085 310/339 |
| 2012/0169055 | A1 * | 7/2012 | Rastegar | F03B 13/20 290/53 |
| 2014/0028027 | A1 * | 1/2014 | Rastegar | F03B 13/20 290/53 |
| 2014/0319970 | A1 * | 10/2014 | Sherrit | H02N 2/185 310/339 |

(Continued)

*Primary Examiner* — Thomas Dougherty
(74) *Attorney, Agent, or Firm* — King & Spalding LLP

(57) ABSTRACT

A piezoelectric power generation system includes a housing defining an opening therethrough and a support structure disposed within the housing, the support structure comprising a plurality of portions. The piezoelectric power generation system also includes one or more piezoelectric elements disposed between two of the plurality of portions of the support structure within the housing. Movement or vibration in the support structure compresses the one or more piezoelectric elements, wherein the one or more piezoelectric elements generate electric energy when compressed. The piezoelectric power generation system further includes one or more exciters coupled to the support structure, wherein the exciters move or vibrate when acted on by a flow of fluid, wherein the motion of vibration of the one or more exciters is translated to the support structure and ultimately to the one or more piezoelectric elements.

19 Claims, 4 Drawing Sheets

(56) References Cited

U.S. PATENT DOCUMENTS

| | | | |
|---|---|---|---|
| 2016/0090821 A1* | 3/2016 | Kim | E21B 41/0085 |
| | | | 166/53 |
| 2016/0111980 A1* | 4/2016 | Sun | H02N 2/185 |
| | | | 310/339 |
| 2016/0126866 A1* | 5/2016 | Kim | H01L 41/083 |
| | | | 310/339 |
| 2016/0126867 A1* | 5/2016 | Kim | H02N 2/186 |
| | | | 310/339 |

* cited by examiner

SYSTEM AND METHOD FOR ELECTRIC POWER GENERATION USING STRUCTURED STACKED PIEZOELECTRIC ARRAYS

RELATED APPLICATIONS

The present application is related to U.S. patent application Ser. No. 14/529,593, titled "SYSTEM AND METHOD FOR ELECTRIC POWER GENERATION USING STRUCTURED PIEZOELECTRIC ARRAYS," and filed concurrently herewith; and U.S. patent application Ser. No. 14/529,701, titled "SYSTEM AND METHOD FOR ELECTRIC POWER GENERATION USING PIEZOELECTRIC MODULES," and filed concrurrently herewith.

TECHNICAL FIELD

The present application relates to remote power generation. Specifically, the present application relates to fluid flow induced power generation using stacked piezoelectric components disposed in a support structure in which the stacked piezoelectric components are protected from the flow stream.

BACKGROUND

In certain downhole operations, power is needed to run various components of a downhole assembly. For example, power is needed to drive actuators for valves and other components, and to power various sensors and communication devices. In many cases, power is generated downhole via a downhole power generation device that is coupled to the downhole assembly. Some of the devices may be designed to use mechanical power from the fluid flow to generate electric power downhole such as the mechanisms using flow induced vibration. For example, piezoelectric elements have been used in such devices to generate electric energy when actuated by the fluid flow. The current state of the art is to expose small and independent piezoelectric elements to the main flow stream, which causes the piezoelectric elements to vibrate and generate electricity. Typically, the flow stream induces a relatively high frequency of vibration, such as 1 kHz or higher. However, such flow streams are likely to carry particulates and debris. Thus, when the piezoelectric elements are directly exposed to the particle-laden flow stream, the piezoelectric elements are likely to experience increased fatigue and erosion caused by the particulates. Additionally, the high vibrational frequency induced by the flow stream further adds to the fatigue experienced by the piezoelectric elements These factors translate into a shortened operational life of the power generation system.

SUMMARY

In one aspect of the present disclosure, a piezoelectric power generation system includes a housing and a support structure disposed within the housing. The support structure includes a plurality of portions. The support structure is defined by an outer profile and an inner profile. The inner profile defines an orifice through which a tubing can be disposed. A cross-section of the support structure is one of a plurality of geometric and non-geometric shapes. The piezoelectric power generation system further includes one or more stacked piezoelectric components disposed adjacent to one of the plurality of portions or between two of the plurality of portions. The piezoelectric power generation system also includes one or more exciters coupled to the support structure and extending through and out of the housing. The exciters, when actuated, transfer vibrational motion to the support structure, which actuates the one or more stacked piezoelectric components.

In another aspect, a piezoelectric power generation system includes a housing defining an opening therethrough and a support structure disposed within the housing, the support structure comprising a plurality of portions. The piezoelectric power generation system also includes one or more piezoelectric elements disposed between two of the plurality of portions of the support structure within the housing. Movement or vibration in the support structure applies force to the one or more piezoelectric elements, thereby causing the one or more piezoelectric elements to generate electric energy. The piezoelectric power generation system further includes one or more exciters coupled to the support structure, wherein the exciters move or vibrate when acted on by a flow of fluid, wherein the motion of vibration of the one or more exciters is translated to the support structure and ultimately to the one or more piezoelectric elements.

In another aspect, a method of piezoelectric power generation includes moving or vibrating one or more exciters when fluid flows past the one or more exciters. The method also includes translating movement or vibration of the one or more exciters to a support structure, wherein the support structure is disposed within a housing, and wherein the one or more exciters are coupled to the support structure and extend away from the support structure. The method also includes moving, vibrating, or compressing the support structure, and compressing one or more stacked piezoelectric components, wherein the one or more stacked piezoelectric components are disposed between one or more portions of the support structure. The method also includes generating electric energy by compressing the one or more piezoelectric elements.

These and other aspects, objects, features, and embodiments will be apparent from the following description and the appended claims.

BRIEF DESCRIPTION OF THE DRAWINGS

The drawings illustrate only example embodiments of the present disclosure, and are therefore not to be considered limiting of its scope, as the disclosures herein may admit to other equally effective embodiments. The elements and features shown in the drawings are not necessarily to scale, emphasis instead being placed upon clearly illustrating the principles of the example embodiments. Additionally, certain dimensions or positions may be exaggerated to help visually convey such principles. In the drawings, reference numerals designate like or corresponding, but not necessarily identical, elements. In one or more embodiments, one or more of the features shown in each of the figures may be omitted, added, repeated, and/or substituted. Accordingly, embodiments of the present disclosure should not be limited to the specific arrangements of components shown in these figures.

DETAILED DESCRIPTION OF EXAMPLE EMBODIMENTS

Figure 1:
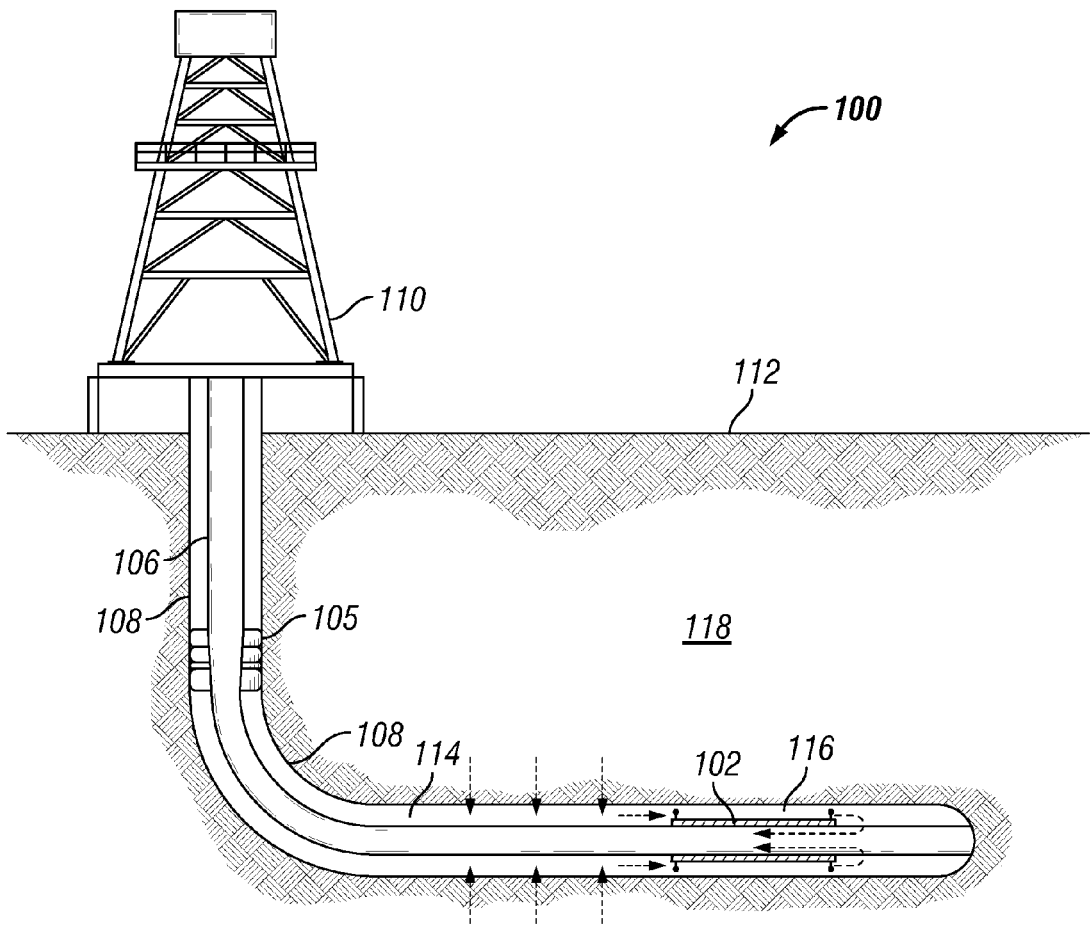
FIG. 1 illustrates a schematic diagram of a well site in which a piezoelectric power generation system has been deployed, in accordance with example embodiments of the present disclosure.

Example embodiments directed to a power generation system having a structured piezoelectric array will now be described in detail with reference to the accompanying figures. Like, but not necessarily the same or identical, elements in the various figures are denoted by like reference numerals for consistency. In the following detailed description of the example embodiments, numerous specific details are set forth in order to provide a more thorough understanding of the disclosure herein. However, it will be apparent to one of ordinary skill in the art that the example embodiments disclosed herein may be practiced without these specific details. In other instances, well-known features have not been described in detail to avoid unnecessarily complicating the description. The example embodiments illustrated herein include certain components that may be replaced by alternate or equivalent components in other example embodiments as will be apparent to one of ordinary skill in the art. Additionally, the present disclosure illustrates the system in the context of a down-hole application. However, in practice, the techniques and systems of the present disclosure can be used in a multitude of applications, including above-ground applications such as pipelines, as well as underwater operations, and other applications which provide a fluid flow and require remote power generation.

Referring now to the drawings, FIG. 1 illustrates a schematic diagram of a well site 100 in which a piezoelectric power generation system 102 has been deployed, in accordance with example embodiments of the present disclosure. In certain example embodiments, and as illustrated, the piezoelectric power generation system 102 (hereinafter "power generation system") is deployed in a wellbore 108. The wellbore 108 is formed in a subterranean formation 118 and coupled to a rig 110 on a surface 112 of the formation 118. The formation 118 can include one or more of a number of formation types, including but not limited to shale, limestone, sandstone, clay, sand, and salt. The surface 112 may be ground level for an on-shore application or the sea floor for an off-shore application. In certain embodiments, a subterranean formation 118 can also include one or more reservoirs in which one or more resources (e.g., oil, gas, water, steam) are located. In certain example embodiments, the wellbore 108 is cased with cemented metal piping or other casing material, which is perforated to allow fluids to flow from the formation 118 into the wellbore 108. In certain example embodiments, the well 108 is a multi-zone well. A production tubing 106 is disposed downhole within the wellbore 108. Fluids are recovered and brought to the rig 110 through the production tubing. In certain example embodiments, a production packer 105 is coupled to the production tubing 106.

Figure 2:
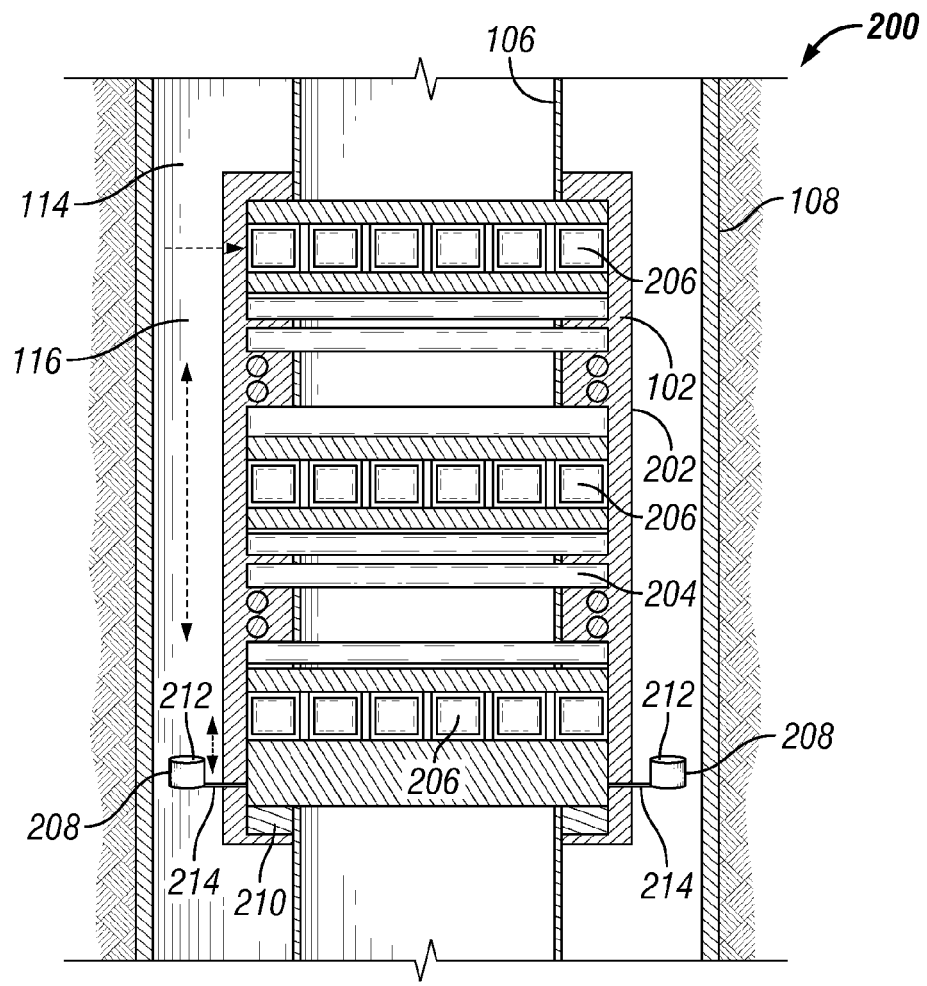
FIG. 2 illustrates a partially cut away view of a piezoelectric power generation system disposed around a production tubing, in accordance with example embodiments of the present disclosure.
Figure 3:
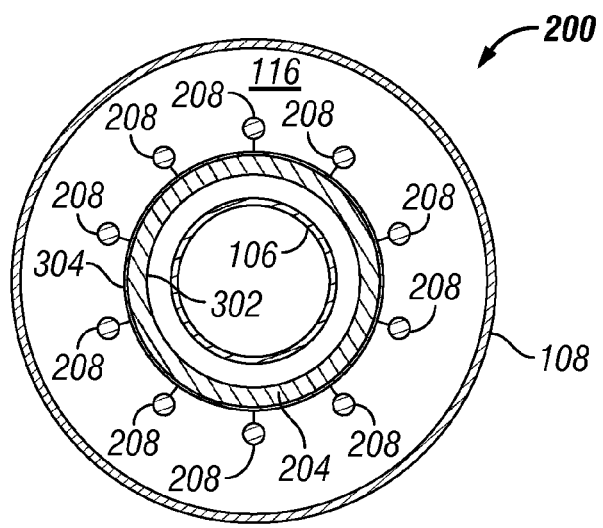
FIG. 3 illustrates a width-wise cross-sectional diagram of a piezoelectric power generation system disposed around a production tubing, in accordance with example embodiments of the present disclosure.

In certain example embodiments, the power generation system 102 is disposed in an annular space 114 around a portion of the production tubing 106. The annular space 114 is the space between the production tubing 106 and the wellbore 108. In the example embodiment of FIG. 1, the power generation system 102 is disposed directly around the production tubing, leaving an external annulus 116 between the power generation system 102 and the wellbore 108. Thus, in such example embodiments, production fluid flows past the power generation system 102 through the external annulus 116. FIG. 2 illustrates a partially cut away view 200 of the power generation system 102 disposed around the production tubing 106, in accordance with example embodiments of the present disclosure. FIG. 3 illustrates a width-wise cross-sectional diagram of the power generation system 102, in accordance with example embodiments of the present disclosure. Referring to FIGS. 1, 2, and 3, in certain example embodiments, the power generation system 102 includes a housing 202, a support structure 204, one or more stacked piezoelectric components 206, and one or more exciters 210.

In certain example embodiments, the support structure 204 is disposed within the housing 202 and includes an inner profile 302 and an outer profile 304. In certain example embodiments, the inner profile 302 defines a path or orifice through which the production tubing 106 is disposed. In certain example embodiments, the support structure 204 has an overall tubular shape with a circular or oval cross-sectional profile. In certain other example embodiments, the support structure 204 has a square cross-sectional profile. In certain further example embodiments, the cross-sectional profile of the support structure 204 is one of a plurality of geometric, polygonal, or non-geometric shapes.

In certain example embodiments, the support structure 204 is coil shaped, or includes several portions with one or more of the stacked piezoelectric components 206 disposed therebetween. In certain example embodiments, two separate portions of the support structure 204 are coupled to each other such that compressive motion is allowed between the two separate portions. In certain example embodiments, two separate portions of the support structure 204 are coupled via a row or layer of stacked piezoelectric components 206 disposed between the two separate portions. Thus, compressive motion between the two separate portions compresses the stacked piezoelectric components 206. The stacked piezoelectric components 206, when compressed, generate electric energy. In certain example embodiments, the support structure 204 is tubular, and comprises multiple tubular segments separated by stacked piezoelectric components 206. In certain example embodiments, the power generation device 102 includes a plurality of layers of stacked piezoelectric components 206 disposed between two separate portions of the support structure 204. In certain example embodiments, the power generation device 102 includes one or more layers of stacked piezoelectric components 206 disposed between various portions of the support structure 204. In certain example embodiments, the power generation device 102 includes alternating layers of portions of support structure 204 and layers of stacked piezoelectric components 206. In certain example embodiments, one or more portions of the support structure 204 comprise a spring, such as a compression or helical spring. In certain example embodiments, the spring is any configuration of a structure having a desired degree of longitudinal rigidity and elasticity, or resilience. In certain other example embodiments, one or more portions of the support structure 204 are rigid, translating substantially all compression to the stacked piezoelectric components 206.

In alternate example embodiments, the support structure 204 can have other shapes or configurations that can apply tension or compression forces to the stacked piezoelectric components 206. Such other configurations can cause the support structure to exhibit a variety of motions including longitudinal motion, lateral motion, twisting motion, vibration, or longitudinal waves. In certain example embodiments, such movement causes force, such as tension or compression forces, to be applied to the stacked piezoelectric components 206, thereby generating electric energy.

In certain example embodiments, the support structure 204 has any structural configuration which allows for compression of the stacked piezoelectric components disposed therewithin. In certain example embodiments, the support structure 204 is constructed of a metallic material. In certain example embodiments, the support structure 204 is designed to vibrate at a certain known resonant frequency. In such embodiments, the stacked piezoelectric components are also compressed accordingly at a corresponding known frequency. In certain example embodiments, the stacked piezoelectric components 206 are also compressed in phase. Thus, the one or more stacked piezoelectric components 206 generate electric energy in phase. Additionally, the frequency can also be selected through design of the support structure 204.

In certain example embodiments, the one or more stacked piezoelectric components 206 are each made up of many layers of piezoelectric material, which generate electric energy when stressed or compressed. In certain example embodiments, the one or more stacked piezoelectric components 206 are replaced by a single sheet of piezoelectric material. In certain example embodiments, movement of the support structure 204 causes longitudinal vibrations in the stacked piezoelectric components 206, which causes the stacked piezoelectric components 206 to generate electric energy in a longitudinal vibration mode. In certain other example embodiments, the stacked piezoelectric components 206 generate electric energy through a flexural vibration mode, a torsional vibration mode, a shear vibration mode, a longitudinal vibration mode, or any combination thereof.

In certain example embodiments, the housing 202 encases the support structure 204 and the stacked piezoelectric components 206. In certain example embodiments, when the power generation system is installed, the housing 202 encases the support structure 204 and stacked piezoelectric components 206 around the production tubing 106, thereby separating the support structure 204 and stacked piezoelectric components 206 from the external annulus 116. In certain example embodiments, the housing 202 has a similar shape as the support structure 204 and can be tubular. In certain example embodiments, the housing 202 substantially shields the support structure 204 and the one or more stacked piezoelectric components 206 from an environment exterior to the housing, such as the direct flow of fluid through the external annulus 116.

In certain example embodiments, the one or more exciters 208 are coupled to the support structure 204 and extend through and out of the housing 202, such that the exciters 208 stick out of the housing 202 and into the external annulus 116 between the power generation system 102 and the wellbore 108. In certain example embodiments, small apertures such as slots are formed in the housing 202 which allow the exciters 208 to traverse the housing 202 and have a certain range of motion within the apertures. In certain example embodiments, the apertures allow for a nominal amount of fluid exchange between the inside of the housing 202 and the outside of the housing 202. In certain example embodiments, when in use, the exciters 208 are exposed to the direct flow of fluid in the external annulus 116. The flow of fluid against the exciters causes the exciters to move or vibrate. As the exciters are coupled to the support structure 204, the vibrational movement or energy is transferred to the support structure 204, causing the support structure 204 to move or vibrate. In certain example embodiments, the fluid flows in a direction normal to the exciters, causing the exciters to move up and down.

Additionally, in certain example embodiments, the fluid flows in a direction normal to the stacked piezoelectric components 206 and in the same direction as the compressive direction of the stacked piezoelectric components 206. The movement of the exciters 208 caused by the traversing fluid flow causes the support structure 204 to move back and forth along the same axis of motion. This causes the stacked piezoelectric components 206 disposed between the portions of the support structure 204 to be compressed, generating electric energy. The support structure 204 then translates the vibrational movement or energy to the stacked piezoelectric components 206, and electric power is generated. The exciters 208 can be arranged in various configurations, such as in a ring as illustrated in FIG. 3, in a row, and the like. The number and position of the exciters 208 can be selected based on certain factors such as the fluid flow rate, and vibrational frequency, and desired frequency of electric power generation, and the like.

In certain example embodiments, the power generation system 102 is disposed adjacently against and within the wellbore 108, eliminating the external annulus 116, and leaving an internal annulus between the power generation system 102 and the production tubing 106. In such example embodiments, production fluid flows past the power generation system 102 through the internal annulus. In such example embodiments, the exciters 208 extend out of the housing 202 and into the internal annulus, where the exciters are 208 are moved by the flow of fluid through the internal annulus between the power generation device 102 and the production tubing 106.

In certain example embodiments, each exciter 208 includes an end portion 212 and a stem 214. The end portion 212 includes a larger surface area, which provides enough opposition against the flow of fluid such that the end portion 212 is moved and/or set in vibration. The stem 214 is thinner and provides enough flexibility to allow the end portion 212 to be moved by the flow of fluid. The exciters 208 are coupled to the support structure 204 via the stem 214. In certain example embodiments, a piece of material may be placed between the stem 214 and the support structure 204. In certain such embodiments, the piece of material is configured to augment the vibrational frequency of the exciters 208 such that the vibrational motion and energy received by the support structure 204 has more desirable parameters. For example, the piece of material may have a dampening or exaggerating effect. The one or more exciters are designed and fabricated to be robust against erosion and other degenerative effects of fluid flow.

Figure 4:
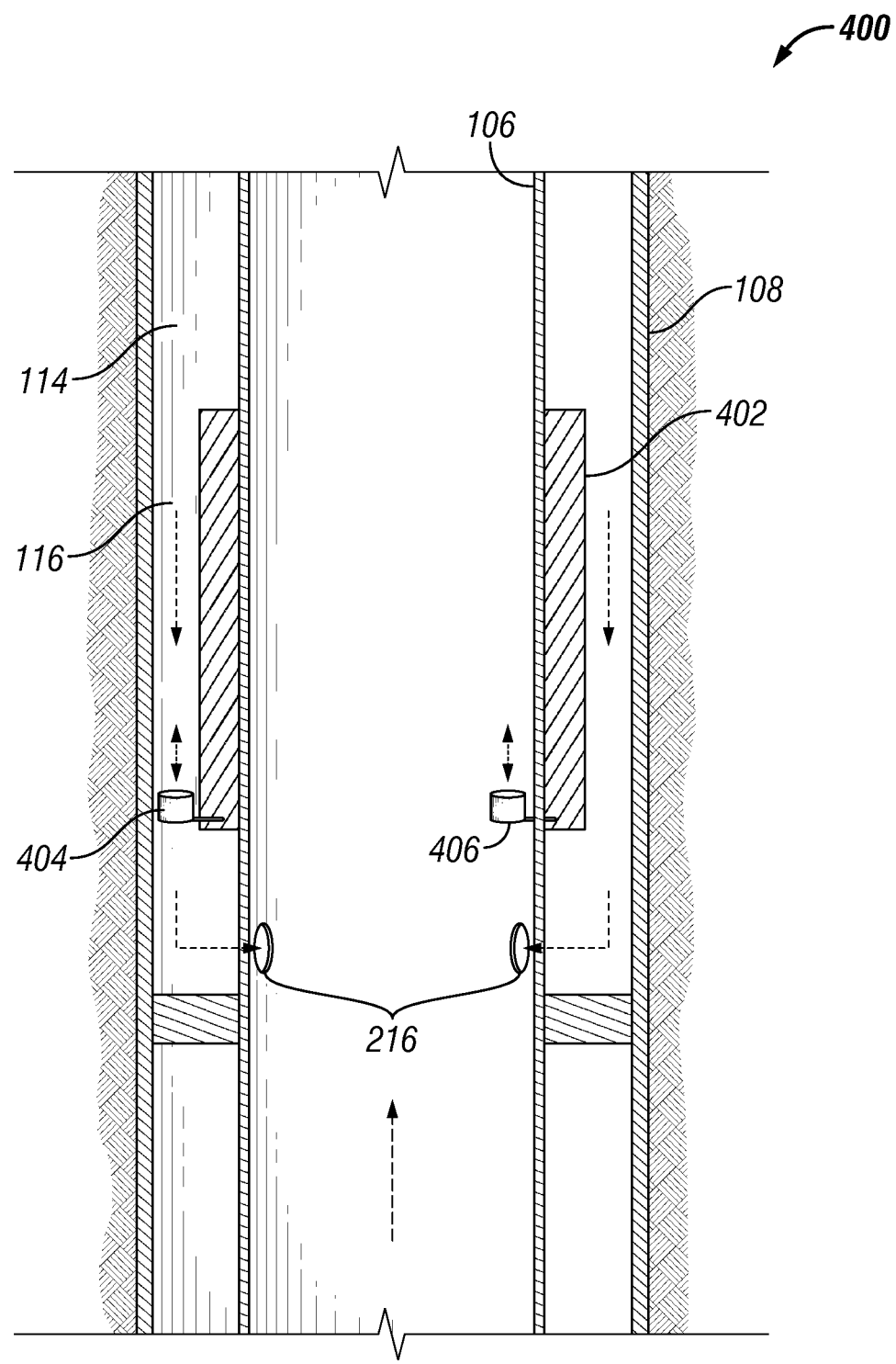
FIG. 4 illustrates a length-wise cross-sectional diagram of a piezoelectric generation system having an outwardly extending exciter and an inwardly extending exciter, in accordance with example embodiments of the present disclosure.

FIG. 4 illustrates a length-wise cross-sectional diagram 400 of a piezoelectric generation system 402 having an outwardly extending exciter 404 and an inwardly extending exciter 406, in accordance with example embodiments of the present disclosure. In certain example embodiments, the outwardly extending exciter 404 extends outwardly from the support structure and out of the housing, where it is exposed to the flow of fluids in the external annulus 116. In certain example embodiments, the inwardly extending exciter 406 extends inwardly from the support structure and into the production tubing 106, wherein it is exposed to the flow of fluids in the production tubing 106. In such example embodiments, the flow of fluid inside the production tubing 106 flows past and actuates the exciters 406. In certain example embodiments, the piezoelectric generation systems 102, 402 can have all outwardly extending exciters 404, all inwardly extending exciters 406, or a combination of both.

In certain example embodiments, the power generation system 102 further includes electric circuitry and a power storage device 210, such as a battery, a capacitor, and the like. The power storage device 210 is coupled to the one or more stacked piezoelectric components 206 such that electric energy generated by the stacked piezoelectric components 206 is stored in the power storage device 210. In certain example embodiments, the power storage device 210 is coupled to the stacked piezoelectric components 206 via one or more processing components which process the electric energy generated by the piezoelectric components into a storable form. In certain example embodiments, the power storage device 210 is disposed within the housing 202. In certain example embodiments, the power storage device 210 is distinctly coupled to individual or groups of stacked piezoelectric components 206 such that if certain stacked piezoelectric components 206 fail, the remaining are still able to generate and send power to the power storage device 210.

In certain example embodiments, the production tubing 106 includes perforations 216 made at an end of the production tubing 106 past a portion of the production tubing 106 around which the power generation system 102 is to be disposed. As fluid, such as production fluid comes into the wellbore 108, the fluid flows towards the perforations 216 and past the power generation system 102, actuating the exciters. In certain example embodiments the exciters 208 are coupled to the inner profile 302 of the support structure and extend through the production tubing 106 such that the end portion 208 is within the production tubing 106. In such example embodiments, the flow of fluid inside the production tubing 106 flows past and actuates the exciters 208.

Figure 5:
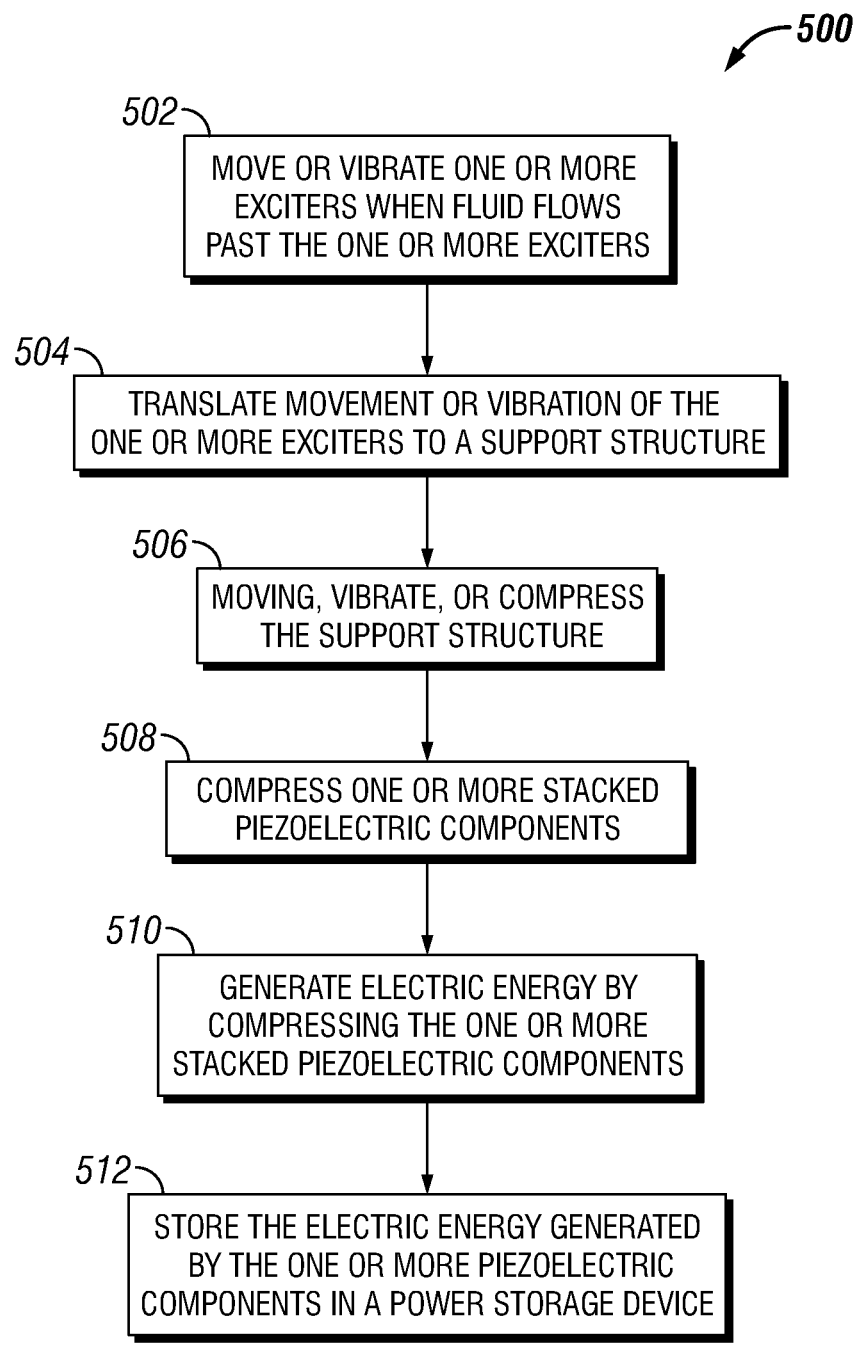
FIG. 5 illustrates a method of generating power using a piezoelectric power generation system, in accordance with example embodiments of the present disclosure.

FIG. 5 illustrates a method 500 of piezoelectric power generation, in accordance with example embodiments of the present disclosure. In certain example embodiments, the method 500 includes moving or vibrating the one or more exciters 208 when fluid flows past the one or more exciters 208 (step 502). The method further includes translating movement or vibration of the one or more exciters 208 to the support structure 204, for example via the stem 214 (step 504). In certain example embodiments, the support structure 204 is disposed within the housing 202, and the one or more exciters 208 are coupled to the support structure 204. In certain example embodiments, the method further includes moving, vibrating, or compressing the support structure 204 (step 506). The one or more stacked piezoelectric components 206 are disposed on and in contact with the support structure 204. The method further includes compressing the one or more stacked piezoelectric components 206 (step 508). In certain example embodiments, the one or more stacked piezoelectric components 206 are disposed between one or more portions of the support structure. The method also includes generating electric energy by compressing the one or more stacked piezoelectric components 206 (step 510). In certain example embodiments, the method 500 also includes storing the electric energy generated by the one or more stacked piezoelectric components 206 in a power storage device 210 (step 512). In certain example embodiments, the steps of the method 500 may occur in a different order than the order in which they were discussed above. The steps may also be repeated or omitted.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. A piezoelectric power generation system, comprising:
   a housing;
   a support structure disposed within the housing and comprising a plurality of portions, the support structure defined by an outer profile and an inner profile, the inner profile defining an orifice through which a tubing can be disposed, wherein a cross-section of the support structure is one of a plurality of geometric and non-geometric shapes;
   one or more stacked piezoelectric components disposed adjacent to one of the plurality of portions of the support structure or between two of the plurality of portions of the support structure; and
   one or more exciters coupled to the support structure and extending through and out of the housing, wherein the one or more exciters, when actuated, transfer vibrational motion to the support structure, which actuates the one or more stacked piezoelectric components.

2. The piezoelectric power generation system of claim 1, wherein the support structure comprises a spring.

3. The piezoelectric power generation system of claim 1, wherein the cross-section is a square, circle, oval, or polygon.

4. The piezoelectric power generation system of claim 1, further comprising an electric circuit and a power storage device coupled to the one or more stacked piezoelectric components, the electric circuit and power storage device configured to process and store electric energy generated by the one or more stacked piezoelectric components.

5. The piezoelectric power generation system of claim 1, wherein the one or more stacked piezoelectric components generate electric energy through compressive vibration.

6. The piezoelectric power generation system of claim 4, wherein each or a subset of the one or more stacked piezoelectric components is independently coupled to the power storage device, wherein when the each or the subset of the one or more stacked piezoelectric components fails, the remaining of the one or more piezoelectric components are still able to provide generated energy to the power storage device.

7. A piezoelectric power generation system, comprising:
   a housing, the housing defining an opening therethrough;
   a support structure disposed within the housing, the support structure comprising a plurality of portions;
   one or more piezoelectric elements disposed between two of the plurality of portions of the support structure within the housing, wherein the one or more piezoelectric elements comprise one or more stacked piezoelectric components; and one or more exciters coupled to the support structure, wherein the one or more exciters move when acted on by a flow of fluid, wherein the motion of the one or more exciters is translated to the support structure, which applies force to the one or more piezoelectric elements causing them to generate electricity.

8. The piezoelectric power generation system of claim 7, further comprising:
alternating layers of portions of the support structure and layers of piezoelectric elements.

9. The piezoelectric power generation system of claim 7, wherein at least one of the one or more exciters extend inwardly from the housing, extending from the support structure towards the opening.

10. The piezoelectric power generation system of claim 7, wherein the housing substantially shields the support structure and the one or more piezoelectric elements from an environment exterior to the housing.

11. The piezoelectric power generation system of claim 7, further comprising an electric circuit and a power storage device coupled to the one or more stacked piezoelectric components, the electric circuit and power storage device configured to process and store electric energy generated by the one or more stacked piezoelectric components.

12. The piezoelectric power generation system of claim 11, wherein each or a subset of the one or more piezoelectric elements is independently coupled to the power storage device, wherein when the each or the subset of the one or more piezoelectric elements fails, the remaining of the one or more piezoelectric elements are still able to provide generated energy to the power storage device.

13. A method of piezoelectric power generation, comprising:
moving one or more exciters when fluid flows past the one or more exciters;
translating movement of the one or more exciters to a support structure causing the support structure to move, wherein the support structure is disposed within a housing, and wherein the one or more exciters are coupled to the support structure and extend away from the support structure;
the movement of the support structure applying force to one or more stacked piezoelectric components, wherein the one or more stacked piezoelectric components are disposed between one or more portions of the support structure; and
generating electric energy by the force applied to the one or more stacked piezoelectric components.

14. The method of piezoelectric power generation of claim 13, comprising:
storing the electric energy generated by the one or more stacked piezoelectric components in a power storage device.

15. The method of piezoelectric power generation of claim 13, wherein the support structure is configured to vibrate at a resonant frequency, and the one or more stacked piezoelectric components generate electric energy in phase.

16. The method of piezoelectric power generation of claim 13, wherein the housing isolates the support structure and the one or more stacked piezoelectric components from fluid flow outside of the housing.

17. The method of piezoelectric power generation of claim 13, wherein the support structure is a spring.

18. The method of piezoelectric power generation of claim 14, wherein each or a subset of the one or more stacked piezoelectric components is independently coupled to the power storage device, wherein when the each or the subset of the one or more piezoelectric elements fails, the remaining of the one or more piezoelectric elements are still able to provide generated energy to the power storage device.

19. The method of piezoelectric power generation of claim 13, wherein the housing comprises a central opening through which a fluid carrying tubing is disposed.

* * * * *